US011833662B2

(12) United States Patent
Ditmore et al.

(10) Patent No.: US 11,833,662 B2
(45) Date of Patent: Dec. 5, 2023

(54) WAFER HANDLING ROBOT WITH RADIAL GAS CURTAIN AND/OR INTERIOR VOLUME CONTROL

(71) Applicant: Lam Research Corporation, Fremont, CA (US)

(72) Inventors: Charles N. Ditmore, Oakland, CA (US); Richard M. Blank, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/802,137

(22) PCT Filed: Feb. 23, 2021

(86) PCT No.: PCT/US2021/019264
§ 371 (c)(1),
(2) Date: Aug. 25, 2022

(87) PCT Pub. No.: WO2021/173568
PCT Pub. Date: Sep. 2, 2021

(65) Prior Publication Data
US 2023/0074285 A1    Mar. 9, 2023

Related U.S. Application Data

(60) Provisional application No. 62/982,626, filed on Feb. 27, 2020.

(51) Int. Cl.
*H01L 21/677* (2006.01)
*B25J 11/00* (2006.01)
(Continued)

(52) U.S. Cl.
CPC .......... *B25J 11/0095* (2013.01); *B25J 18/04* (2013.01); *B25J 19/0079* (2013.01); *B25J 19/0083* (2013.01); *H01L 21/67766* (2013.01)

(58) Field of Classification Search
CPC ..... H01L 21/67766; B25J 9/042; B25J 9/043; B25J 11/0095; B25J 19/0079; B25J 19/0083
See application file for complete search history.

(56) References Cited

U.S. PATENT DOCUMENTS 6,352,265 B1 * 3/2002 Ha ........................... F16J 15/40
277/432
6,688,189 B2 * 2/2004 Hashimoto ............ B25J 18/025
414/935
(Continued)

FOREIGN PATENT DOCUMENTS

CN    114378838 A  *  4/2022
JP    60189219 A  *  9/1985  ......... C23C 16/4584
(Continued)

OTHER PUBLICATIONS

International Preliminary Report on Patentability dated Sep. 9, 2022, in PCT Application No. PCT/US2021/019264.
(Continued)

*Primary Examiner* — Gerald McClain
(74) *Attorney, Agent, or Firm* — Weaver Austin Villeneuve & Sampson LLP

(57) ABSTRACT

A collar may be provided having an aperture through it through which the turret of a wafer handling robot may be extended or retracted. The collar may have one or more radial gas passages. Gas directed inwards towards the turret from the radial passage(s) may turn downward when it strikes the turret. A bellows may be optionally affixed to the bottom of the turret and to the bottom of the base such that the volume of the base occupied by the turret and the bellows remains generally fixed regardless of the degree to which the turret is extended from the base.

17 Claims, 7 Drawing Sheets

(51) Int. Cl.
*B25J 18/04* (2006.01)
*B25J 19/00* (2006.01)

(56) References Cited

U.S. PATENT DOCUMENTS

| | | |
|---|---|---|
| 2013/0078060 A1 | 3/2013 | Furuichi |
| 2013/0323002 A1* | 12/2013 | Furuichi ........... H01L 21/67742 |
| | | 414/744.5 |
| 2015/0013910 A1 | 1/2015 | Krupyshev et al. |
| 2022/0059395 A1* | 2/2022 | Dogome .............. B25J 19/0079 |

FOREIGN PATENT DOCUMENTS

| | | |
|---|---|---|
| JP | H10247678 A | 9/1998 |
| JP | 2002231781 A | 8/2002 |
| JP | 6120031 B2 | 4/2017 |

OTHER PUBLICATIONS

International Search Report and Written Opinion dated Jun. 1, 2021 in PCT Application No. PCT/US2021/019264.

* cited by examiner

WAFER HANDLING ROBOT WITH RADIAL GAS CURTAIN AND/OR INTERIOR VOLUME CONTROL

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools often make use of an equipment front-end module (EFEM), which is a large chamber or vestibule that is part of a semiconductor processing tool and which provides, generally on one side, load ports for receiving front-opening unified pods (FOUPs) used to transport wafers in bulk, e.g., 25 at a time, between semiconductor processing tools. EFEMs may also generally have, usually on a side opposite the load ports, one or more load locks or other interfaces for introducing wafers into a transfer chamber or processing chamber. A wafer handling robot is typically located within the EFEM in order to transfer wafers between the load ports and the load locks, as well as potentially other stations in the EFEM, e.g., wafer aligners.

Wafer handling robots used in EFEMs often include the capability to move wafers both horizontally, via articulated arms that have arm links that are each configured to rotate relative to the arm links they are attached to, and vertically, e.g., via a linear translation mechanism that raises or lowers the entire robot arm assembly.

Presented herein are improved wafer handling robot configurations that are particularly well-suited for use in certain types of EFEMs, e.g., such as those that may have a corrosive environment inside, e.g., an environment with elevated moisture levels or having one or more gases present such as chlorine, fluorine, or other corrosive substances.

SUMMARY

Details of one or more implementations of the subject matter described in this specification are set forth in the accompanying drawings and the description below. Other features, aspects, and advantages will become apparent from the description, the drawings, and the claims.

The present inventors conceived of at least two different mechanisms that may be used either in isolation or in tandem to provide an improved wafer handling robot. Both mechanisms reduce the likelihood of particulate contamination resulting from vertical (z-axis) movement of the wafer handling robot.

Wafer handling robots with z-axis capability typically include a base, which may be fixed with respect to the chamber or structure that supports them (such as an EFEM; such structures may simply be referred to herein as chambers, although this is to be understood to be inclusive of EFEMs as well), a turret that is mounted to the base in a manner that allows the turret to be moved vertically relative to the base, and one or more robot arms that are supported by the turret and actuated by motors located in the turret. The turret is typically largely contained within the base when the wafer handling robot is at its lowest vertical position and may rise up out of the base through an opening in the base when elevated to a raised position. The present inventors determined that vertical movement of the turret relative to the base was a source of particulate contamination since, with each lowering or raising of the turret, air (or whatever atmosphere is present in the chamber) would be forced out of or drawn into the base due to the displacement of the turret within the base. For example, for a turret that is 8" in diameter and has a vertical travel of 18", the turret may displace over half a cubic foot of volume as it travels.

Such displacement may cause gas that is located within the base to be expelled into the ambient environment surrounding the wafers in the chamber or similar structure when the wafer handling robot is actuated to lower the robot arm, which may cause particulates that originate from equipment within the base to be expelled into the chamber, where it may come into contact with and contaminate wafers that may be in the chamber. Such displacement may also cause air from within the chamber to be drawn into the base of the wafer handling robot when the wafer handling robot is actuated so as to raise the robot arm, which may present issues in chambers that have corrosive gases present. Such corrosive gases may damage components internal to the base, e.g., bearings, motors, electrical cables, etc., which may affect the performance or operability of the wafer handling robot. Such corrosion may also, it was recognized, result in further particulate generation, which may increase the chances of a wafer being subjected to particulate contamination due to movement of the wafer handling robot.

The present inventors conceived of two particulate mitigation technologies that may be used in wafer handling robots such as those described above to mitigate or eliminate particulate contamination that is attributable to turret displacement of such wafer handling robots.

The first technology is a collar or other structure that provides a radial gas curtain that extends completely around the turret at a location near the top of the base. The radial gas curtain may deliver a thin, radial stream of air (or other gas, such as nitrogen) towards the turret across a relatively small gap. This gas curtain, after it bridges the gap, strikes the side of the turret and turns so as to flow in generally vertical directions; some of this air flows into the base of the wafer handling robot and the rest of the air flows into the chamber. The portion of air that flows into the base will tend to push against or counter whatever flow of air may be trying to flow out of the base at the location of the gas curtain, thereby causing whatever particulates that may be entrained in such air to remain within the base. The portion of air that flows into the base may also tend to increase the internal pressure within the base (if the base has exhaust vents to allow such gas to escape that are sized small enough to allow a positive pressure differential between the base and the ambient environment to develop). The resulting positive pressure in the base. relative to the chamber, may prevent corrosive elements from entering the base at locations other than the location of the gas curtain. The portion of the air that flows from the collar or other structure and into the chamber will tend to push against or counter whatever flow of air may be trying to flow into the base at the location of the gas curtain, thereby causing whatever corrosive elements that may be entrained in such air to remain within the chamber. It will be understood that while frequent reference is made herein to "air," other gases may be used in place of air, e.g., nitrogen, as discussed earlier.

The second technology is a bellows unit that may be affixed to the bottom end of the turret on one end and to the base on the other end. Thus, the bellows unit may expand into the interior volume of the base when the turret is raised and may compress when the turret is lowered. The bellows may act to cause the free volume within the base to remain generally constant regardless of the vertical position of the turret relative to the base. As a result, there may be little or no gross displacement of air from the base due to the vertical movement of the turret relative to the base. The bellows may also act to prevent potentially corrosive air from the ambient environment of the chamber from being drawn into the base from the bottom.

While either technology may reduce the likelihood or severity of particulate contamination on its own, using both technologies may have a synergistic effect that may allow for the particulate generation rate of the wafer handling robot vertical movement system within the chamber to be reduced to effectively nothing, e.g., <10 particles in a 72 minute window.

In some implementations, an apparatus may be provided that includes one or more robot arms, a turret supporting the one or more robot arms, a linear translation mechanism supporting the turret, and a base supporting the linear translation mechanism. In such an apparatus, the linear translation mechanism may be configured to translate the turret, as well as the one or more robot arms, along a first axis relative to the base, the base may include an aperture sized to allow at least a first portion of the turret to pass therethrough when the turret is translated along the first axis, the aperture may have one or more radial gas passages extending around substantially all of the aperture, the one or more radial gas passages may be fixed in size, a first gap may exist between an interior edge of the aperture and the first portion of the turret, and the first gap may extend around the outer perimeter of the first portion of the turret.

In some implementations of the apparatus, the first gap between the first portion of the turret and the interior edge of the aperture may be free of any intervening structure around substantially all of the turret.

In some implementations of the apparatus, the one or more radial gas passages may have a minimum width in a direction parallel to the first axis that is less than 1 mm.

In some implementations of the apparatus, the one or more radial gas passages may have a minimum width in a direction parallel to the first axis that is less than 0.5 mm.

In some implementations of the apparatus, the one or more radial gas passages may have a minimum width in a direction parallel to the first axis that is less than or equal to 0.25 mm.

In some implementations of the apparatus, one or more radial gas passages may be at least partially defined by one or more first surfaces and one or more second surfaces, and the one or more first surfaces may face towards the one or more second surfaces and may be separated from the one or more second surfaces by a second gap.

In some implementations of the apparatus, the one or more first surfaces and the one or more second surfaces may be perpendicular to the first axis.

In some implementations of the apparatus, each of the one or more first surfaces may define a first cross-sectional radial profile with respect to a second axis that is parallel to the first axis and centered on the aperture, each of the one or more second surfaces may define a second cross-sectional radial profile with respect to the second axis, the cross-sectional radial profiles may include the one or more first cross-sectional radial profiles and the one or more second cross-sectional radial profiles may each be in a corresponding plane that is coincident with and parallel to the second axis, each first cross-sectional radial profile may define an average first linear radial profile that is within ±30° of perpendicular to the second axis, and each second cross-sectional radial profile may define an average second linear radial profile that is within ±30° of perpendicular to the second axis.

In some implementations of the apparatus, the apparatus may further include one or more plenum volumes, one or more gas inlets, and one or more flow control components configured to regulate flow of gas to the one or more gas inlets. In such implementations, each gas inlet may be fluidically connected with one of the one or more plenum volumes, each of the one or more plenum volumes may be fluidically connected with at least one of the one or more gas inlets, each of the one or more gas inlets may be fluidically interposed between one of the one or more plenum volumes and one of the one or more flow control components, and each of the one or more plenum volumes may be fluidically interposed between one of the one or more gas inlets and the one or more radial gas passages.

In some implementations of the apparatus, the apparatus may further include one or more gas sources, and the one or more flow control components may be fluidically connected with the one or more gas sources and configured to cause gas from the one or more gas sources to be provided to the one or more plenum volumes at a rate of between 25 and 150 standard liters per minute. In such implementations, the one or more radial gas passages may be sized such that the gas from the one or more plenum volumes flows from the one or more radial gas passages with a velocity of at least 5 m/s.

In some implementations of the apparatus, the first portion of the turret may have a first nominally circular cross-section and the aperture may have a corresponding second nominally circular cross-section with a diameter larger than the diameter of the first nominally circular cross-section.

In some implementations of the apparatus, the one or more radial gas passages may include only a single gas passage that is in the form of a radial slit that extends around the entire aperture without any disruptions in continuity.

In some implementations of the apparatus, the first gap may be between 0.5 mm and 5 mm around the turret.

In some implementations of the apparatus, the apparatus may further include a bellows. A first end of the bellows may be fixed relative to an end of the turret located within the base, a second end of the bellows opposite the first end may be fixed relative to a surface of the base on an opposite side of the base from the aperture, the bellows may expand responsive to translation of the turret away from the surface of the base, and the bellows may contract responsive to translation of the turret towards the surface of the base.

In some implementations of the apparatus, the bellows may have a first average enclosed cross-sectional area when viewed along the first axis, the outermost surface or surfaces of the first portion of the turret may define a second average cross-sectional area when viewed along the first axis, and the first average enclosed cross-sectional area may be substantially equal to the second average cross-sectional area.

In some implementations of the apparatus, the first portion of the turret may be nominally circular and may have a first nominal diameter, the bellows may have a plurality of pleats, each pleat may have an inner diameter and an outer diameter, and the average of the inner diameters and outer diameters of the pleats may be substantially equal to the first nominal diameter.

In some implementations of the apparatus, the base may have one or more vents in the surface of the base and within a region encircled by the bellows when viewed along the first axis.

In some implementations, an apparatus may be provided which includes one or more robot arms, a turret supporting the one or more robot arms, a linear translation mechanism supporting the turret, a bellows, and a base supporting the linear translation mechanism. In such implementations, the linear translation mechanism may be configured to translate the turret, as well as the one or more robot arms, along a first axis relative to the base, the base may include an aperture sized to allow at least a first portion of the turret to pass therethrough when the turret is translated along the first axis, a first end of the bellows may be fixed relative to a first end of the turret located within the base, a second end of the bellows opposite the first end of the bellows may be fixed relative to a first surface of the base on an opposite side of the base from the aperture, the bellows may expand responsive to translation of the turret away from the surface of the base, and the bellows may contract responsive to translation of the turret towards the surface of the base.

In some implementations of the apparatus, there may be no bellows connecting the turret with a second surface of the base opposite the first surface of the base.

In some implementations of the apparatus, the bellows may have a first average enclosed cross-sectional area when viewed along the first axis, the outermost surface or surfaces of the first portion of the turret may define a second average cross-sectional area when viewed along the first axis, and the first average enclosed cross-sectional area may be substantially equal to the second average cross-sectional area.

In some implementations of the apparatus, the first portion of the turret may be nominally circular and may have a first nominal diameter, the bellows may have a plurality of pleats, each pleat may have an inner diameter and an outer diameter, and the average of the inner diameters and outer diameters of the pleats may be substantially equal to the first nominal diameter.

In some implementations of the apparatus, the base may have one or more vents in the surface of the base and within a region encircled by the bellows when viewed along the first axis.

In some implementations of the apparatus, the aperture may have one or more radial gas passages extending around substantially all of the aperture, the one or more radial gas passages may be fixed in size, a first gap may exist between an interior edge of the aperture and the first portion of the turret, and the first gap may extend around the outer perimeter of the first portion of the turret.

In some implementations of the apparatus, the first gap between the first portion of the turret and the interior edge of the aperture may be free of any intervening structure.

In some implementations of the apparatus, the one or more radial gas passages may have a minimum width in a direction parallel to the first axis that is less than 1 mm.

In some implementations of the apparatus, the one or more radial gas passages may have a minimum width in a direction parallel to the first axis that is less than 0.5 mm.

In some implementations of the apparatus, the one or more radial gas passages may have a minimum width in a direction parallel to the first axis that is less than or equal to 0.25 mm.

In some implementations of the apparatus, the one or more radial gas passages may be at least partially defined by one or more first surfaces and one or more second surfaces, and the one or more first surfaces may face towards the one or more second surfaces and may be separated from the one or more second surfaces by a second gap.

In some implementations of the apparatus, the one or more first surfaces and the one or more second surfaces may be perpendicular to the first axis.

In some implementations of the apparatus, each of the one or more first surfaces may define a first cross-sectional radial profile with respect to a second axis that is parallel to the first axis and centered on the aperture, each of the one or more second surfaces may define a second cross-sectional radial profile with respect to the second axis, the cross-sectional radial profiles including the one or more first cross-sectional radial profiles and the one or more second cross-sectional radial profiles may each be in a corresponding plane that is coincident with and parallel to the second axis, each first cross-sectional radial profile may define an average first linear radial profile that is within ±30° of perpendicular to the second axis, and each second cross-sectional radial profile may define an average second linear radial profile that is within ±30° of perpendicular to the second axis.

In some implementations of the apparatus, the apparatus may further include one or more plenum volumes, one or more gas inlets, and one or more flow control components configured to regulate flow of gas to the one or more gas inlets. In such implementations, each gas inlet may be fluidically connected with one of the one or more plenum volumes, each of the one or more plenum volumes may be fluidically connected with at least one of the one or more gas inlets, each of the one or more gas inlets may be fluidically interposed between one of the one or more plenum volumes and one of the one or more flow control components, and each of the one or more plenum volumes may be fluidically interposed between one of the one or more gas inlets and the one or more radial gas passages.

In some implementations of the apparatus, the apparatus may include one or more gas sources. In such implementations, the one or more flow control components may be fluidically connected with the one or more gas sources and may be configured to cause gas from the one or more gas sources to be provided to the one or more plenum volumes at a rate of between 25 and 150 standard liters per minute and the one or more radial gas passages may be sized such that the gas from the one or more plenum volumes flows from the one or more radial gas passages with a velocity of at least 5 m/s.

In some implementations of the apparatus, the first portion of the turret may have a first nominally circular cross-section and the aperture may have a corresponding second nominally circular cross-section with a diameter larger than the diameter of the first nominally circular cross-section.

In some implementations of the apparatus, the one or more radial gas passages may include only a single gas passage that is in the form of a radial slit that extends around the entire aperture without any disruptions in continuity.

In some implementations of the apparatus, the first gap may be between 0.5 mm and 5 mm around the turret.

DETAILED DESCRIPTION

As discussed above, wafer handling robots used in EFEMs or other types of semiconductor processing tool chambers may utilize systems such as those briefly described above to reduce particulate production by the wafer handling robot and reduce the likelihood of, for example, the internal components of the wafer handling robot from being exposed to corrosive gases (if the wafer handling robot is used in such an environment).

Figure 1:
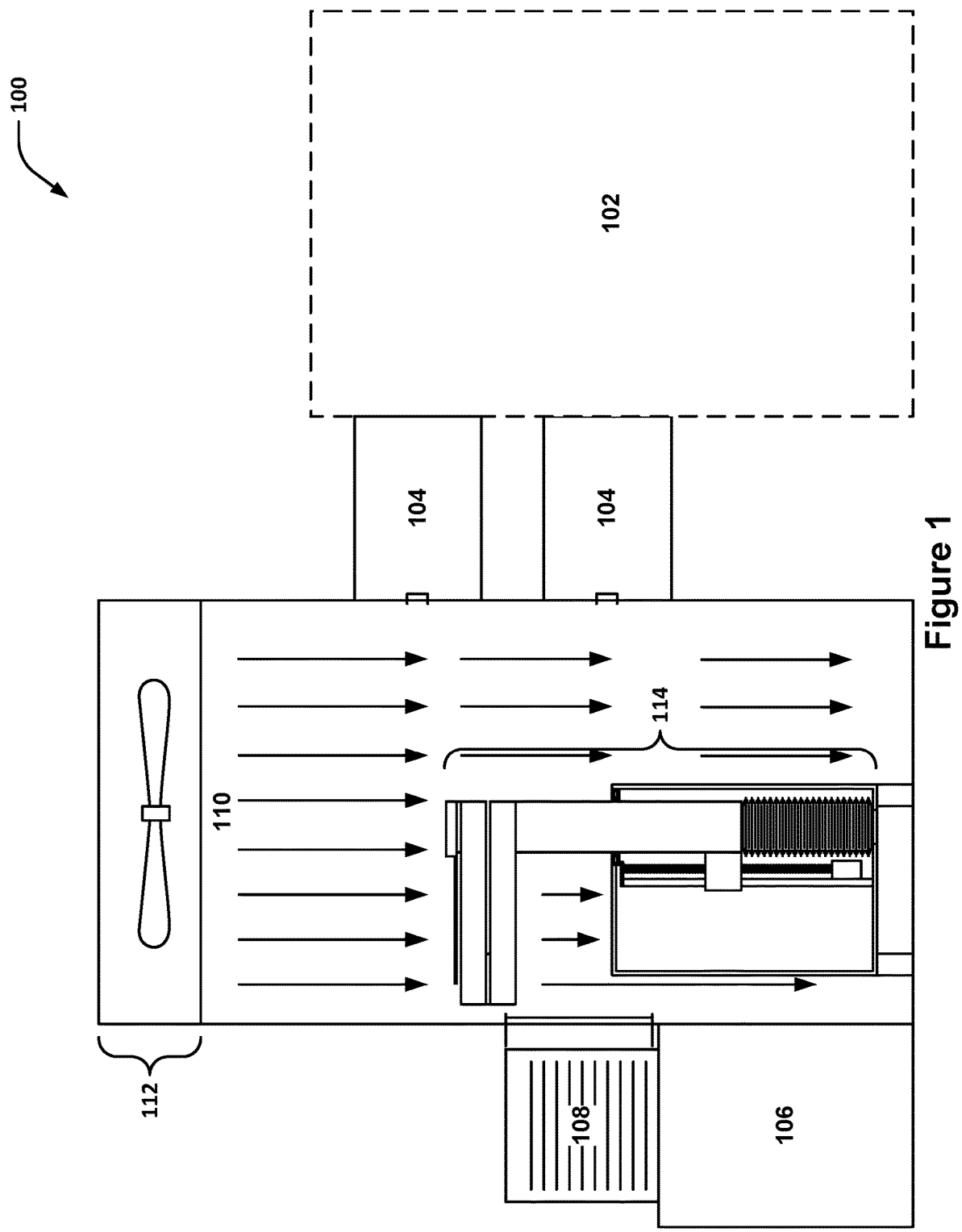
FIG. 1 depicts a diagram of an example semiconductor processing tool.

FIG. 1 depicts a diagram of an example semiconductor processing tool. In FIG. 1, a semiconductor processing tool 100 is shown that includes an EFEM 110 with a wafer handling robot 114 located within. The EFEM 110 may be connected with one or more load ports 106 that may allow wafers housed within a FOUP 108 to be transferred into the EFEM 110 by the wafer handling robot 114. The EFEM 110 may also be connected with a transfer chamber 102 (or other chamber, such as a processing chamber) by one or more loadlocks 104. The EFEM 110 may also be equipped with a fan unit 112 that may cause the air within the EFEM to be forced downward into a vent system in the floor of the EFEM 110; in other implementation, the vent system may simply be connected with a negative pressure source, e.g., an exhaust system with a blower unit, to draw air downward through the EFEM 110 (in yet other implementations, the EFEM may not have a vent system at all).

Figure 2:
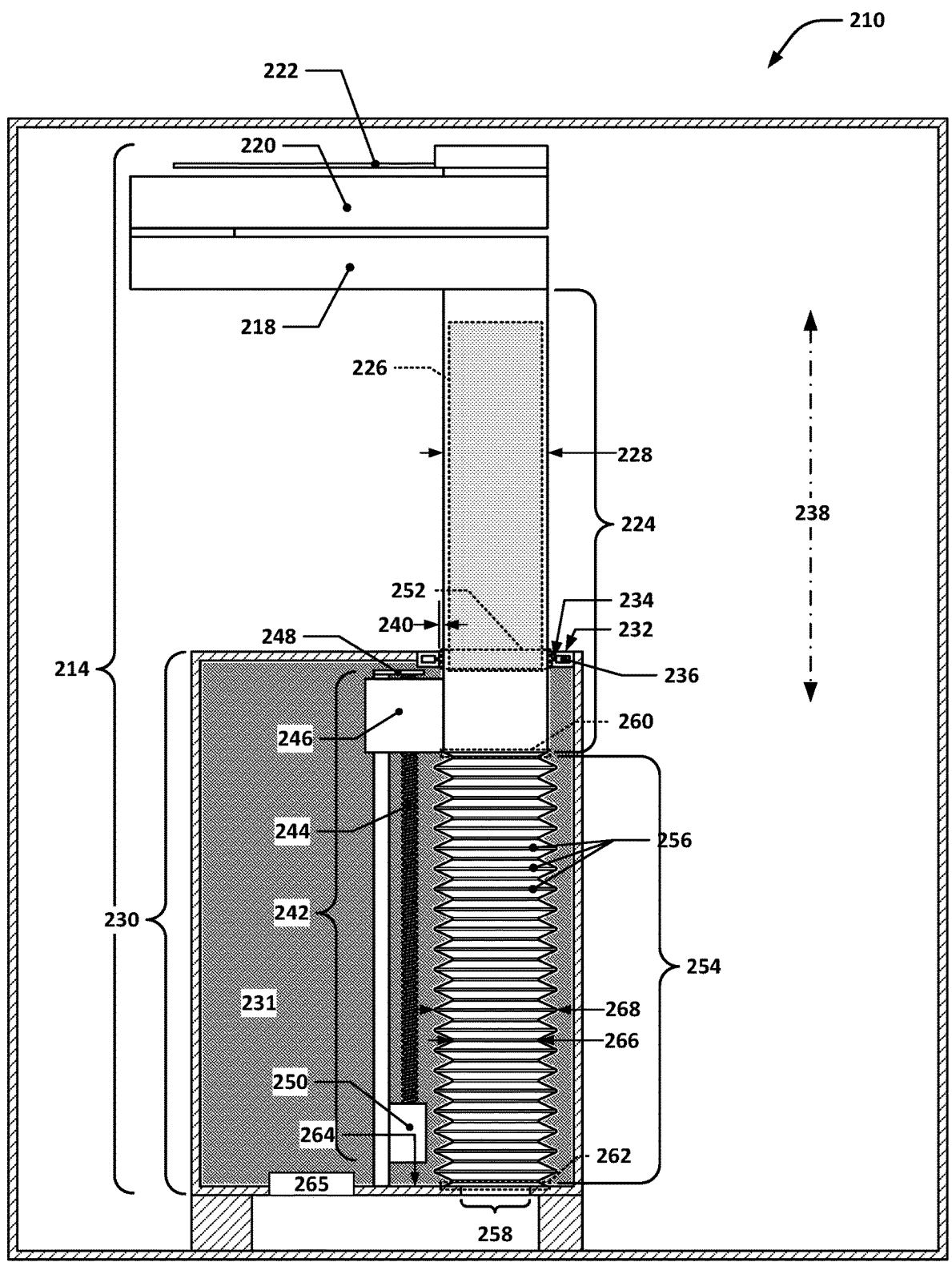
FIG. 2 is a diagram of an example EFEM with an example wafer handling robot in a first configuration.

FIG. 2 is a diagram of an example EFEM with an example wafer handling robot in a first configuration. In FIG. 2, an EFEM 210 is shown; the EFEM 210 in this example is not shown attached to other components, e.g., load ports, load locks, etc., to avoid undue clutter and allow the discussion to focus on the wafer handling robot 214. The wafer handling robot 214 may include, for example, a base 230 that has within it a linear translation mechanism 242 that is configured to raise or lower a turret 224. The linear translation mechanism 242 in this example includes a ball screw 244 that may pass through a ball screw nut 246 that is affixed to the turret 224 and is supported on one end by a bearing support 248 and on the other end by a motor 250. When the motor 250 is actuated to turn the ball screw 244, the ball screw 244 causes the ball screw nut 246 to raise and lower, thereby causing the turret 224 to extend or retract through an aperture 252 along a direction parallel to a first axis 238. The base 230 may have a housing that generally encloses and protects the hardware within the base 230; this housing may, however, have various openings or leak paths through it that may allow for gas to flow between the interior and exterior of the housing (discussed later below).

The turret 224 may support one or more robot arms that may contain, for example, an upper link 218, a lower link 220, and an end effector 222, which may be actuated by various drive motors and other systems located within the turret (or elsewhere).

As discussed earlier, the wafer handling robot may include either or both of two technologies described herein that may mitigate particle generation by the wafer handling robot and/or help protect the wafer handling robot from potential harmful exposure to corrosive ambient environments.

The first technology discussed in more detail below is the inclusion of a radial gas curtain that may be provided by a collar 232 that defines the aperture 252. The collar 232 may include one or more radial gas passages 234 that are fluidically connected with a plenum volume 236 within the collar 232. Gas may be flowed into the plenum volume 236 through one or more gas inlets (not shown) and may then flow towards the turret 224 in a radially inward manner from the one or more radial gas passages 234 at a relatively high velocity, e.g., 5 m/s, 10 m/s, 15 m/s, 20 m/s, 25 m/s, or higher. The one or more radial gas passages 234 may be sized to be relatively thin, e.g., having a height less than or equal to 1 mm, 0.75 mm, 0.5 mm, or 0.25 mm, so as to achieve the desired gas velocity with a reduced amount of volumetric gas flow, e.g., a volumetric gas flow rate of between 25 and 150 standard liters per minute (SLM) or 50 to 100 SLM. A first gap 240 may exist between the turret 224 and the collar 232 to allow a first portion 226 of the turret 224 to translate through the aperture 252 without contacting the collar 232. This first gap 240 may be kept to a value less than or equal to (or between) 5 mm, 4 mm, 3 mm, 2 mm, 1 mm, or 0.5 mm. In this example, the turret 224 is generally cylindrical and has a first nominal diameter 228, and the aperture 252 is a circular aperture with a nominal diameter equal to twice the first gap 240 plus the first nominal diameter 228. It will be understood that other implementations may feature a turret 224 with a different nominal cross-sectional shape, e.g., square, hexagonal, etc., and that the aperture 252 in the collar 232 may be similarly shaped so that the first gap 240 remains generally constant, e.g., ±10% or ±20%, around the perimeter of the first portion 226 of the turret 224.

As noted above and described in more detail later below, a gas such as clean dry air, nitrogen, or other gas that may be compatible with the environment within the EFEM and/or with the wafer handling robot internal components may be flowed through the plenum volume 236, out the one or more radial gas passages 234, and radially inwards towards the outer surface of the turret 224, which may then cause the gas flow to turn so as to flow both upwards and downwards along the outer surface of the turret 224. The portion of the gas that flows downward into the base 230 may serve to push against whatever gases may be attempting to flow out of the base through the first gap 240, thereby resisting the flow of gases, and whatever particulates may be entrained therein, from within the base 230 and through the aperture 252. The base 230 may also have one or more exhaust fans 265 that may be positioned along a surface of the base 230, e.g., the bottom surface 264, of the base 230, and which may be controlled to evacuate gas from within the base so as to relieve pressure from within the base 230. The speed of the fan(s) may be controlled such that the volumetric flow rate of the gas through the fans is nominally equal to the volumetric flow rate of the gas through the aperture 252 and into the base 230, e.g., approximately one half the volumetric flow rate of the gas out of the collar 232. This may allow whatever pressure accumulates within the base 230 due to the gas flow from the collar 232 to bleed off, thereby permitting the gas flow from the collar 232 to continue to counter the flow of gas from within the base 230. The gas that is flowed out of the base 230 by the fans may, in some implementations, be drawn downwards by the downdraft in an EFEM that is equipped with a floor-located exhaust system. In other implementations, the fans 265 may be omitted and replaced by one or more vents or exhaust ports that may be provided to allow gas that is introduced into the base 230 by the collar 232 to vent out of the base 230 and into the ambient environment of the EFEM 210 or other chamber within which the base 230 is located. In such cases, the vents or exhaust port(s) may be sized such that, during normal operation (i.e., with the EFEM 210 or other chamber at a nominal ambient pressure condition used during wafer transfer operations and with the collar 232 or other structure providing a radial gas curtain at a nominal flow rate), an internal pressure is maintained in the base 230 that is at least a few Pascals above that of the ambient pressure within the EFEM 210, thereby preventing or reducing the possibility of corrosive gases in the ambient environment of the EFEM 210 of entering the base 230.

The second technology that may be included in a wafer handling robot, either by itself or in combination with the radial gas curtain discussed above, is the use of a bellows 254 that spans between the bottom of the turret 224 and the bottom surface 264. The bellows 254, which may be made of a flexible material, such as an elastomeric material, elastomer-impregnated textile, or thin metal, may include a first end 260 that is affixed to the bottom surface or surfaces of the turret 224 and a second end 262 that is affixed to the bottom surface 264 of the base 230. The bottom surface 264 of the base 230 may have a vent (or vents) 258 that may allow gas within the bellows 254 to escape when the bellows 254 is compressed, e.g., when the turret 224 is moved from a raised position to a lowered position.

Figure 3:
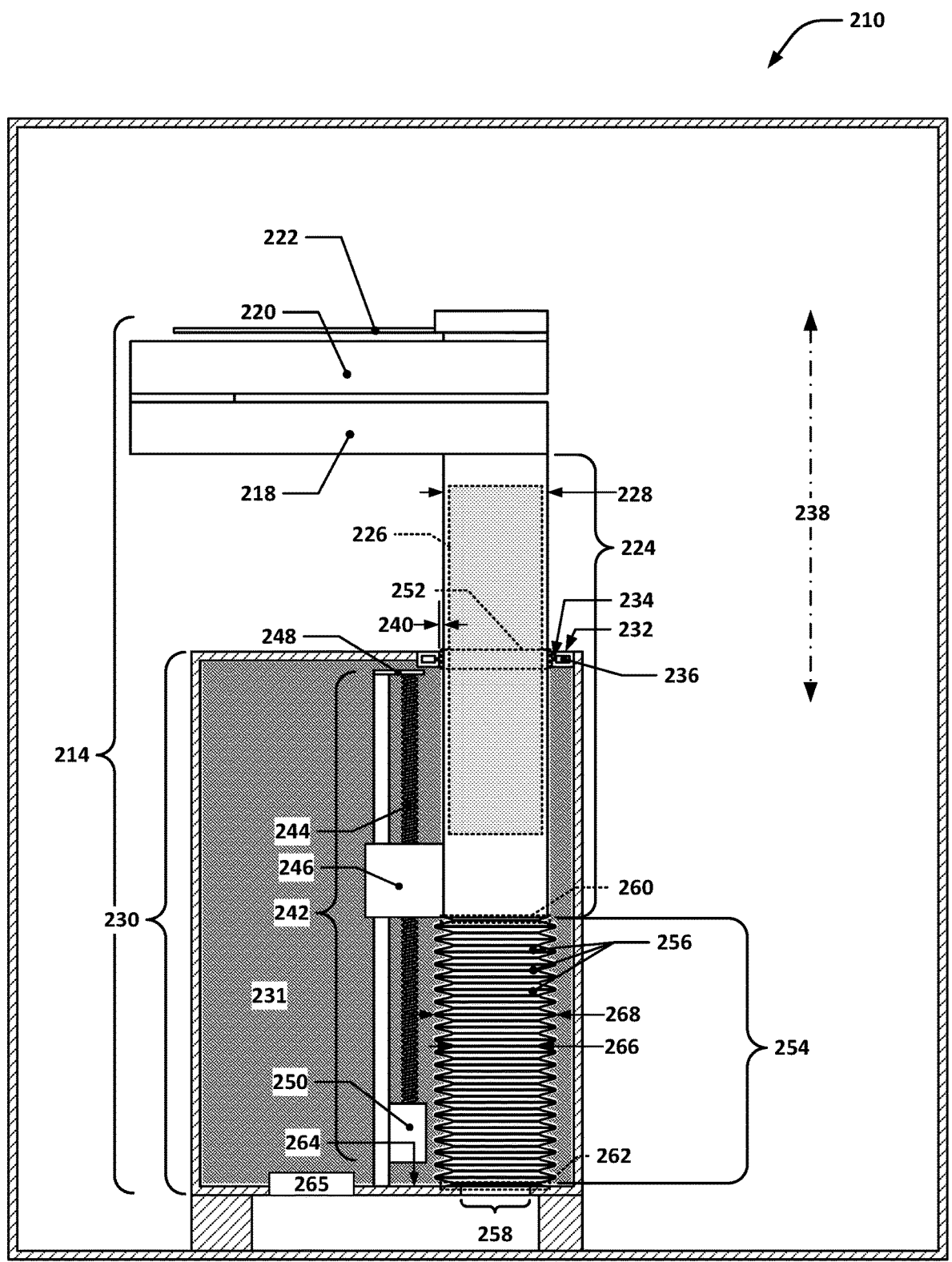
FIG. 3 is a diagram of the example EFEM of FIG. 2 with the example wafer handling robot in a second configuration.
Figure 4:
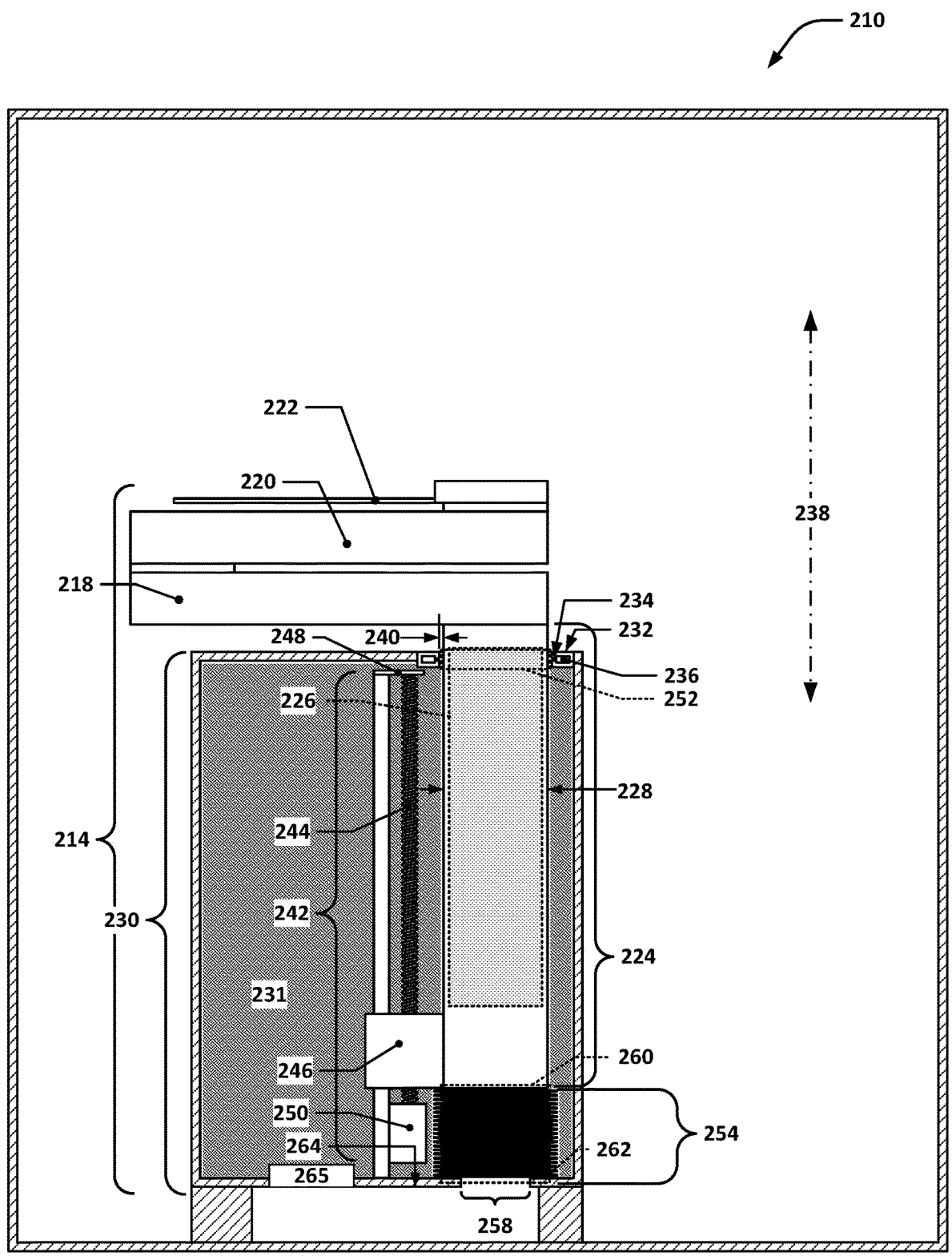
FIG. 4 is a diagram of the example EFEM of FIG. 2 with the example wafer handling robot in a third configuration.

In some implementations, the bellows 254 may have a plurality of pleats 256 that each have an inner diameter 266 and an outer diameter 268. The inner diameter 266 and the outer diameter 268 of the pleats 256 of the bellows 254 may be selected so as to produce an average diameter that is generally equal to, e.g., within ±10% or ±20%, the first nominal diameter 228 of the first portion 226 of the turret 224. By selecting the inner diameter 266 and the outer diameter 268 in this manner, the turret 224 and the bellows 254 together may occupy a volume within the base 230 that remains nominally constant in size regardless of how far or little the turret 224 is extended from the base 230. As a result, when the turret 224 translates into or out of the base 230, the volume of gas that is displaced within the base 230 (which does not include the volume of air that is within the base 230 but "walled off" from the interior volume of the base 230 by the bellows 254) may be negligible. Thus, using a bellows 254 as shown in FIG. 2 prevents the reciprocating action of the turret 224 from causing gas from within the base to be forcibly expelled through the aperture 252 (or at least drastically reduces the amount of such gas that may be expelled). FIG. 3 is a diagram of the example EFEM of FIG. 2 with the example wafer handling robot in a second configuration, e.g., partially extended, and FIG. 4 is a diagram of the example EFEM of FIG. 2 with the example wafer handling robot in a third configuration, e.g., fully retracted. As can be seen in each configuration, the internal volume 231 of the base 230 stays approximately the same regardless of how much the turret 224 is extended or retracted. Accordingly, use of a bellows in the manner shown in FIGS. 2 through 4 may allow the turret 224 of the wafer handling robot 214 to extend or retract with very little in the way of air (or gas) displacement within the base 230. This may drastically reduce the possibility of particulates that are entrained within such gas from being forcibly expelled from the base 230 by such reciprocating action of the turret.

It will also be appreciated that the bellows discussed above may be used in conjunction with turrets that are not nominally cylindrical in shape. In such implementations, the inner and outer diameters of the bellows pleats may be selected so as to define an average cross-sectional area (for example, based on the area within a circle having a diameter that is the average of the inner and outer diameters of the bellows pleats) that is generally equal to the cross-sectional area within the outermost surfaces of the first portion of the turret and within a plane perpendicular to the first axis 238 (or, if a non-circular bellows is used, the average cross-sectional area of the bellows, including the area within the bellows, may be generally equal to the cross-sectional area within the outermost surfaces of the first portion of the turret).

As discussed earlier, the bellows discussed above may be used with or without the radial gas curtain feature discussed previously (and vice versa). The radial gas curtain feature may be configured in a number of different ways, as is discussed in more detail below.

Figure 5:
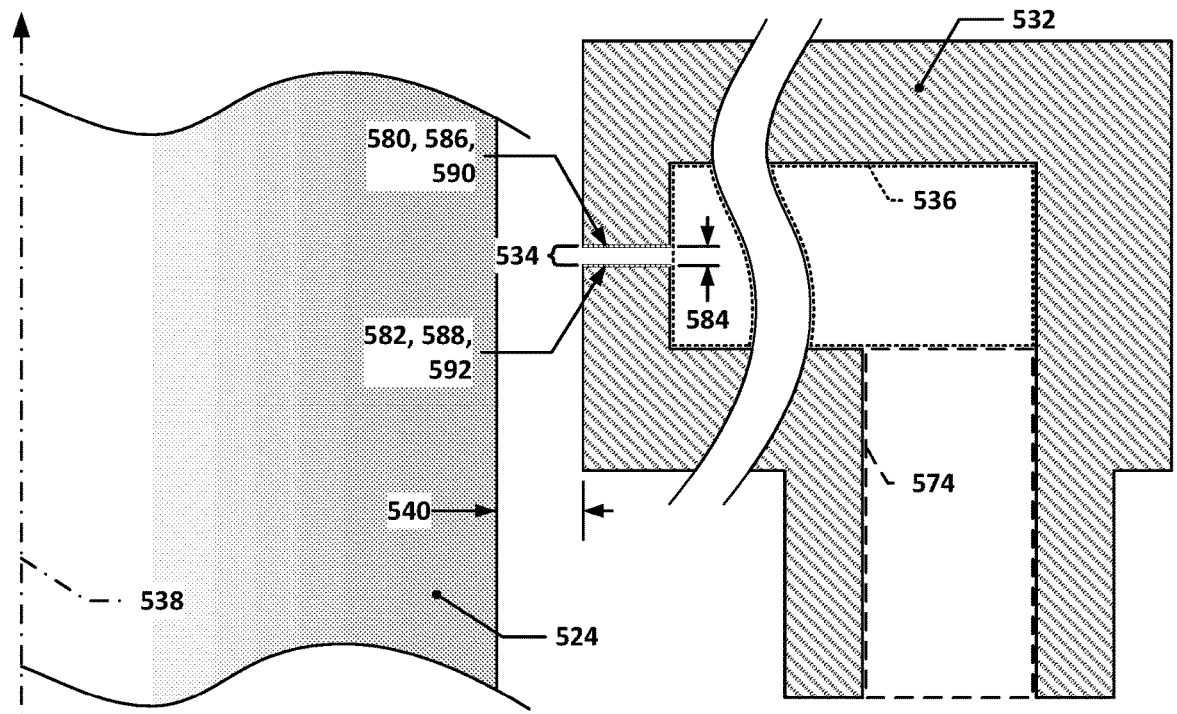
FIG. 5 is a cross-sectional diagram of a portion of an example gas curtain system.

FIG. 5 is a cross-sectional diagram of a portion of an example gas curtain system. As can be seen in FIG. 5, a collar 532 may have a plenum volume 536 that is fed air by one or more gas inlets 574. The plenum volume 536 may be configured to distribute gas from the one or more gas inlets 574 to one or more radial gas passages 534. The one or more radial gas passages 534 may be directed radially inward, e.g., across a first gap 540 and towards turret 524, so as to direct gas, e.g., air, from the plenum volume 536 towards the turret 524. In the implementation shown in FIG. 5, the one or more radial gas passages 534 take the form of a single circumferential radial slit that extends all the way around the turret 524. The radial gas passage 534 in this case is provided by a first surface 580 and a second surface 582, which may face each other and be separated by a second gap 584. The first surface 580 may be defined by a first cross-sectional radial profile 586, which is a line in this example, and may be represented by an average first linear radial profile 590. The second surface 582, similarly, may be defined by a second cross-sectional radial profile 588, which is also a line in this example, and may be represented by an average second linear radial profile 592.

While FIG. 5 shows a linear radial slit, i.e., one in which the average first linear radial profile 590 and the average second linear radial profile 592 are parallel to each other and perpendicular to a first axis 538, as an example radial gas passage, other configurations of radial gas passage may be used as well, including, for example, radial gas passages having curved or sloped first and second surfaces.

Figure 6:
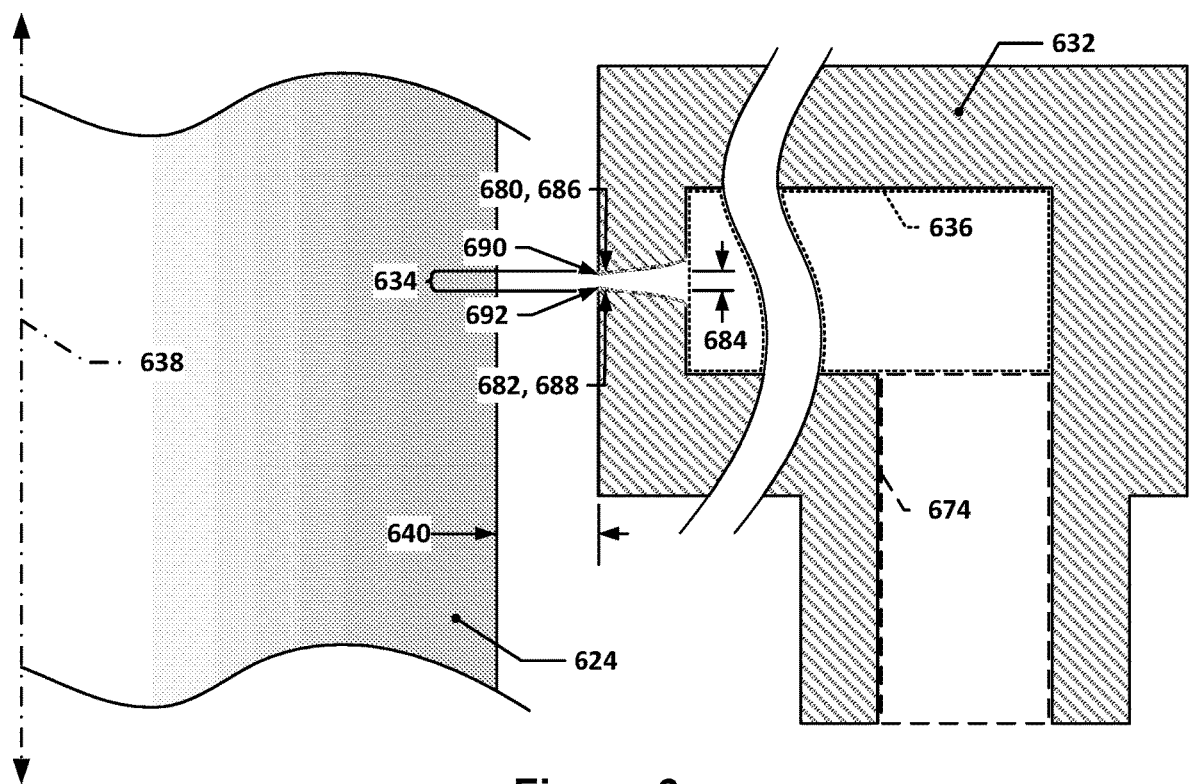
FIG. 6 is a cross-sectional diagram of a portion of another example gas curtain system.

FIG. 6 is a cross-sectional diagram of a portion of another example gas curtain system. The gas curtain system of FIG. 6 is similar to that of FIG. 5, and callouts with the same last two digits in FIG. 6 as in FIG. 5 refer to analogous structures; the reader is referred to the previous discussion in FIG. 5 for discussion of these structures. The gas curtain system of FIG. 6 differs from that of FIG. 5 in that the radial gas passage 634 has a different cross-sectional profile. For example, the radial gas passage 634 is defined by a first surface 680 and a second surface 682. The first surface 680 may have a curved first cross-sectional radial profile 686 which defines an average first linear radial profile 690 and a curved second cross-sectional radial profile 688 that defines an average second linear radial profile 692. In some such implementations, the average first linear radial profile 690 and the average second linear radial profile 692 may each be within ±10°, ±20°, or ±30° of an axis that is perpendicular to the first axis 638. In some further such implementations, the average first linear profile 690 and the average second linear profile 692 may, for example, be angled non-symmetrically relative to the axis that is perpendicular to the first axis 638. For example, the average first linear profile 690 and the average second linear profile 292 may both be angled slightly downward, towards the base, thereby causing the flow of the radial curtain gas to be biased more towards the base 230 than into the EFEM 210 after it strikes the turret 224. In another example, the average first linear profile 690 and the average second linear profile 292 may both be angled slightly upward, away from the base, thereby causing the flow of the radial curtain gas to be biased more into the EFEM 210 than into the base 230 after it strikes the turret 224. This may allow for tuning of the amount of gas that is allocated for preventing air from within the base 230 from entering the EFEM 210 via the aperture 252 versus for preventing gas from within the EFEM 210 from entering the base 230 via the aperture 252.

Figure 7:
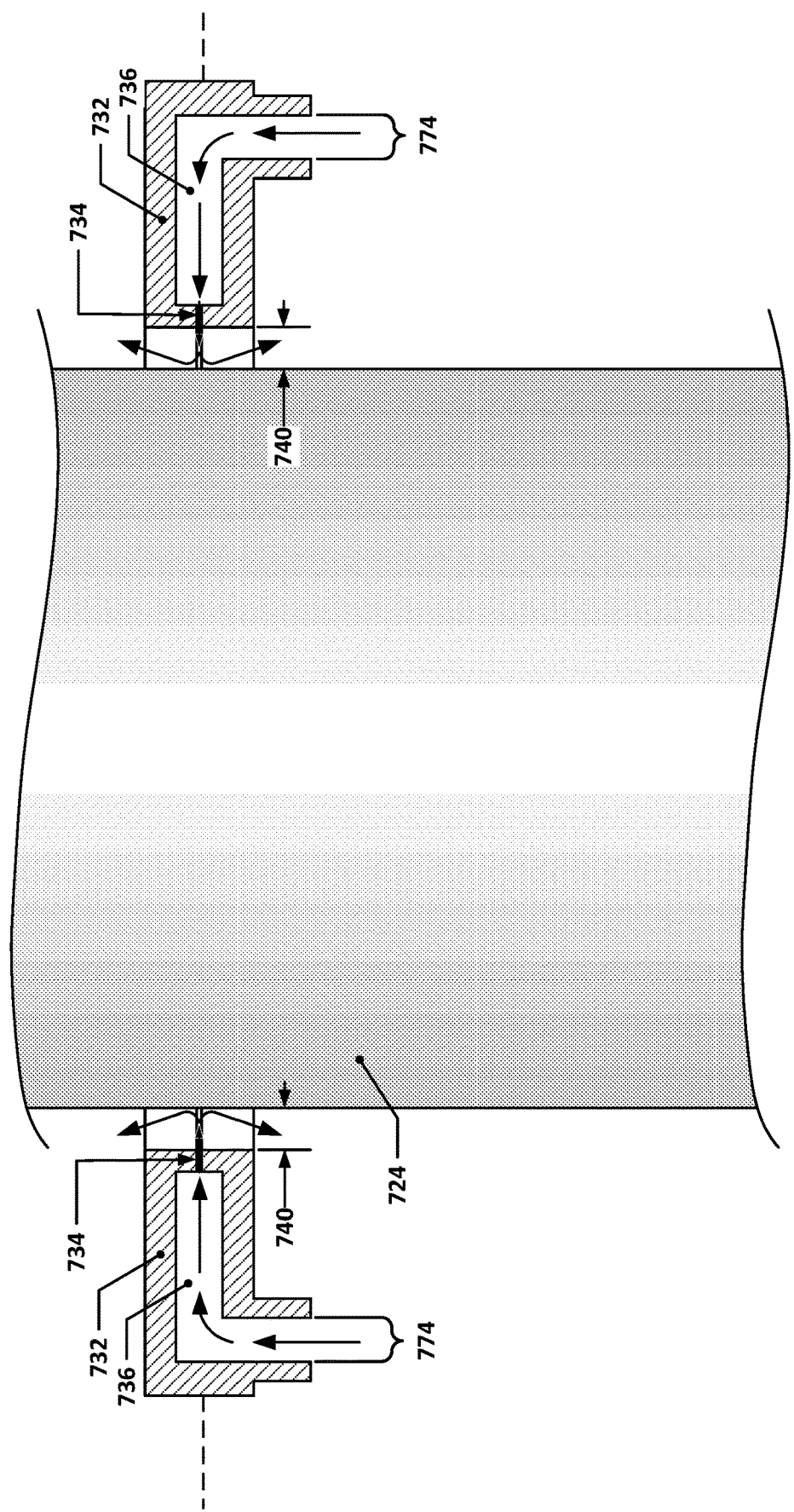
FIG. 7 is a cross-section diagram of another example gas curtain system.

As discussed earlier, the gas that is directed out of the one or more radial gas passages of one of the collars discussed herein may be directed towards the turret of a wafer handling robot. FIG. 7 is a cross-section diagram of an example gas curtain system showing such gas flow. As can be seen in FIG. 7, a collar 732 is shown which has a plenum volume 736 that receives gas from gas inlets 774 (as shown by the air flow arrows) and distributes the gas to a radial gas passage 734. The gas, after being expelled from the radial gas passage 734, is directed radially inward, across a first gap 740, such that it strikes the side of the turret 724. The gas flow then splits into two general directions-upwards, back into the EFEM, and downwards, into the base.

It will be understood that the collars discussed above, and the radial gas passage(s) that they include, may be provided in a number of formats. In some implementations, the collar may be integrated into the housing of the base or another component rather than be a separate component. Some implementations of the gas curtain systems discussed herein may feature radial gas passages of varying geometries. Some of these various implementations are discussed below.

Figure 8:
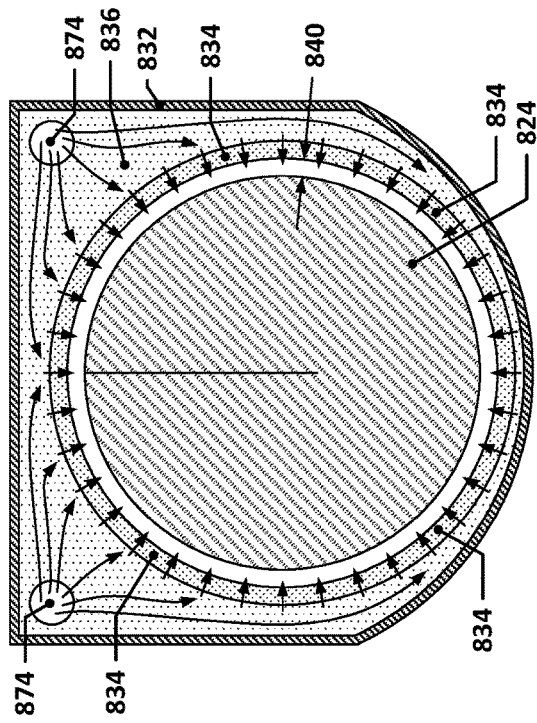
FIG. 8 is a top view section diagram of an example gas curtain system.

FIG. 8 is a top view section diagram of an example gas curtain system. In FIG. 8, a collar 832 is shown that includes a plenum volume 836 that is provided gas through gas inlets 874. A turret 824 extends through an aperture in the collar 832 and is separated from the collar 832 by a first gap 840. Gas from the plenum volume 836 may be flowed across the first gap 840 through a radial gas passage 834 that is, like with some of the earlier collars discussed herein, a single circumferential radial slit. Such a radial gas passage 834 may provide evenly distributed gas flow around the circumference of the turret 824.

Figure 9:
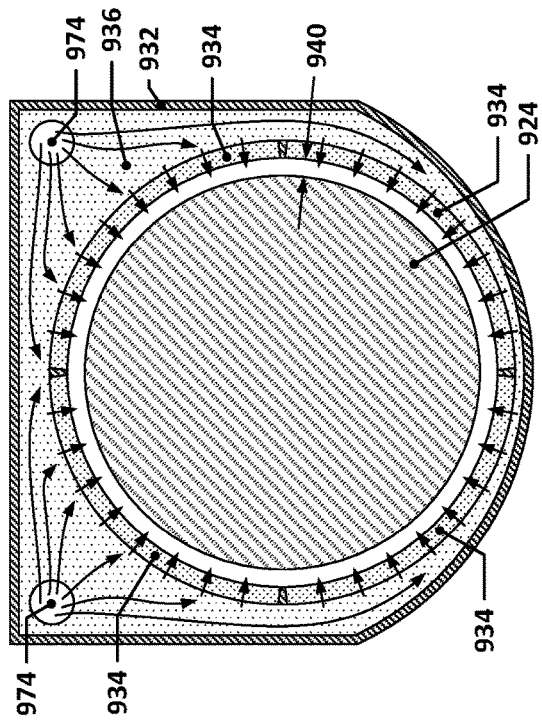
FIG. 9 is a top view section diagram of another example gas curtain system.

FIG. 9 is a top view section diagram of another example gas curtain system. The gas curtain system of FIG. 9 is similar to that of FIG. 8, and callouts with the same last two digits in FIG. 9 as in FIG. 8 refer to analogous structures; the reader is referred to the previous discussion in FIG. 8 for discussion of these structures. The gas curtain system of FIG. 9, in contrast to that of FIG. 8, features four radial gas passages 934, each spanning approximately 90° of arc and separated from the adjoining radial gas passages 934 by a small radial wall (not indicated, but visible at the 12 o'clock, 3 o'clock, 6 o'clock, and 9 o'clock positions). Such an arrangement may provide a substantially continuous radial gas curtain around the circumference of the turret 924 since the small radial walls may provide only minimal interruption of the gas flow. The small radial walls may, however, provide a useful mechanism for helping maintain a constant height for the radial gas passages 934.

Figure 10:
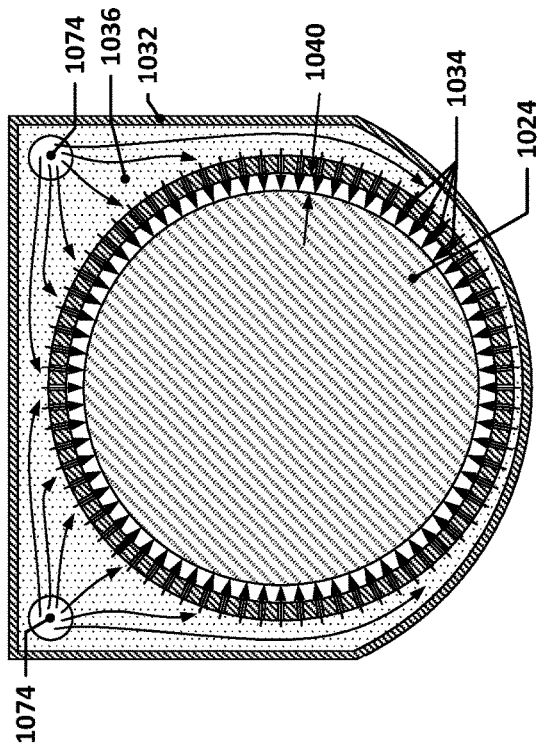
FIG. 10 is a top view section diagram of another example gas curtain system.

FIG. 10 is a top view section diagram of another example gas curtain system. The gas curtain system of FIG. 10 is similar to that of FIG. 8, and callouts with the same last two digits in FIG. 10 as in FIG. 8 refer to analogous structures; the reader is referred to the previous discussion in FIG. 8 for discussion of these structures. In FIG. 10, there are a large number, e.g., 72, of radial gas passages 1034, with each radial gas passage 1034 being a radially extending hole or channel. Such individual radial gas passages may be arranged so that they are arranged in a closely-packed arrangement extending around the outer periphery of the turret 1024 so as to supply a generally continuous curtain of gas around the periphery of the turret 1024 via the individual holes or channels.

It will be appreciated that the radial gas curtain systems discussed above offer consistent and unvarying performance since the one or more radial gas passages that are used in such systems direct gas directly at the turret and fixed in size, i.e., the second gaps of such radial gas passages cannot vary over time (aside from potential thermal expansion effects). This is in contrast to floating seal systems in which a seal that encircles a shaft is caused to "float" in space, cushions by a thin layer of gas that is flowed along its outer, upper, and lower surfaces—in such systems, the gaps through which the gas flows may change in size due to floating movement of the seal, leading to changes in flow conductance of the gaps and accompanying fluctuations in gas flow rate for such gaps. Additionally, the use of a floating seal introduces a further potential source of particulate generation, as the seal itself can potentially contact other components and may thereby generate particulate matter that is then ejected from the seal region and potentially into the EFEM. Such radial gas curtain systems also offer advantages over systems in which an annular plenum around a shaft is provided pressurized gas through, for example, a small number of gas ports, e.g., 2 or 4 or 8 gas ports. In such systems, the gas that flows through smaller annular outlet zones above and below the annular plenum and along the shaft may see circumferential flow fluctuations due to pressure differentials within the annular plenum due to the low number of gas ports as compared with the gas curtain systems discussed herein, which direct a generally continuous radial gas curtain radially inward, thereby creating a more uniform gas flow distribution.

Wafer handling robots having one or both technologies discussed above may be part of a larger semiconductor processing tool, as discussed earlier, which may be controlled by one or more controllers.

The controller may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure. It is to be additionally understood that the above disclosure is intended to encompass at least the following numbered implementations.

Implementation 1: An apparatus comprising: one or more robot arms; a turret supporting the one or more robot arms; a linear translation mechanism supporting the turret; and a base supporting the linear translation mechanism, wherein: the linear translation mechanism is configured to translate the turret, as well as the one or more robot arms, along a first axis relative to the base, the base includes an aperture sized to allow at least a first portion of the turret to pass therethrough when the turret is translated along the first axis, the aperture has one or more radial gas passages extending around substantially all of the aperture, the one or more radial gas passages are fixed in size, a first gap exists between an interior edge of the aperture and the first portion of the turret, and the first gap extends around the outer perimeter of the first portion of the turret.

Implementation 2: The apparatus of implementation 1, wherein the first gap between the first portion of the turret and the interior edge of the aperture is free of any intervening structure around substantially all of the turret.

Implementation 3: The apparatus of implementation 1, wherein the one or more radial gas passages have a minimum width in a direction parallel to the first axis that is less than 1 mm.

Implementation 4: The apparatus of implementation 1, wherein the one or more radial gas passages have a minimum width in a direction parallel to the first axis that is less than 0.5 mm.

Implementation 5: The apparatus of implementation 1, wherein the one or more radial gas passages have a minimum width in a direction parallel to the first axis that is less than or equal to 0.25 mm.

Implementation 6: The apparatus of implementation 1, wherein: one or more radial gas passages are at least partially defined by one or more first surfaces and one or more second surfaces, and the one or more first surfaces face towards the one or more second surfaces and are separated from the one or more second surfaces by a second gap.

Implementation 7: The apparatus of implementation 6, wherein the one or more first surfaces and the one or more second surfaces are perpendicular to the first axis.

Implementation 8: The apparatus of implementation 6, wherein: each of the one or more first surfaces defines a first cross-sectional radial profile with respect to a second axis that is parallel to the first axis and centered on the aperture, each of the one or more second surfaces defines a second cross-sectional radial profile with respect to the second axis, the cross-sectional radial profiles including the one or more first cross-sectional radial profiles and the one or more second cross-sectional radial profiles are each in a corresponding plane that is coincident with and parallel to the second axis, each first cross-sectional radial profile defines an average first linear radial profile that is within ±30° of perpendicular to the second axis, and each second cross-sectional radial profile defines an average second linear radial profile that is within ±30° of perpendicular to the second axis.

Implementation 9: The apparatus of implementation 1, further comprising: one or more plenum volumes; one or more gas inlets; and one or more flow control components configured to regulate flow of gas to the one or more gas inlets, wherein: each gas inlet is fluidically connected with one of the one or more plenum volumes, each of the one or more plenum volumes is fluidically connected with at least one of the one or more gas inlets, each of the one or more gas inlets is fluidically interposed between one of the one or more plenum volumes and one of the one or more flow control components, and each of the one or more plenum volumes is fluidically interposed between one of the one or more gas inlets and the one or more radial gas passages.

Implementation 10: The apparatus of implementation 9, further comprising one or more gas sources, wherein: the one or more flow control components are fluidically connected with the one or more gas sources and are configured to cause gas from the one or more gas sources to be provided to the one or more plenum volumes at a rate of between 25 and 150 standard liters per minute and the one or more radial gas passages are sized such that the gas from the one or more plenum volumes flows from the one or more radial gas passages with a velocity of at least 5 m/s.

Implementation 11: The apparatus of implementation 1, wherein the first portion of the turret has a first nominally circular cross-section and the aperture has a corresponding second nominally circular cross-section with a diameter larger than the diameter of the first nominally circular cross-section.

Implementation 12: The apparatus of implementation 1, wherein the one or more radial gas passages includes only a single gas passage that is in the form of a radial slit that extends around the entire aperture without any disruptions in continuity.

Implementation 13: The apparatus of implementation 1, wherein the first gap is between 0.5 mm and 5 mm around the turret.

Implementation 14: The apparatus of implementation 1, further comprising a bellows, wherein: a first end of the bellows is fixed relative to an end of the turret located within the base, a second end of the bellows opposite the first end is fixed relative to a surface of the base on an opposite side of the base from the aperture, the bellows expands responsive to translation of the turret away from the surface of the base, and the bellows contracts responsive to translation of the turret towards the surface of the base.

Implementation 15: The apparatus of implementation 14, wherein: the bellows has a first average enclosed cross-sectional area when viewed along the first axis, the outermost surface or surfaces of the first portion of the turret define a second average cross-sectional area when viewed along the first axis, and the first average enclosed cross-sectional area is substantially equal to the second average cross-sectional area.

Implementation 16: The apparatus of implementation 14, wherein: the first portion of the turret is nominally circular and has a first nominal diameter, the bellows has a plurality of pleats, each pleat has an inner diameter and an outer diameter, and the average of the inner diameters and outer diameters of the pleats is substantially equal to the first nominal diameter.

Implementation 17: The apparatus of implementation 14, wherein the base has one or more vents in the surface of the base and within a region encircled by the bellows when viewed along the first axis.

Implementation 18: An apparatus comprising: one or more robot arms; a turret supporting the one or more robot arms; a linear translation mechanism supporting the turret; a bellows; and a base supporting the linear translation mechanism, wherein: the linear translation mechanism is configured to translate the turret, as well as the one or more robot arms, along a first axis relative to the base, the base includes an aperture sized to allow at least a first portion of the turret to pass therethrough when the turret is translated along the first axis, a first end of the bellows is fixed relative to a first end of the turret located within the base, a second end of the bellows opposite the first end of the bellows is fixed relative to a first surface of the base on an opposite side of the base from the aperture, the bellows expands responsive to translation of the turret away from the surface of the base, and the bellows contracts responsive to translation of the turret towards the surface of the base.

Implementation 19: The apparatus of implementation 18, wherein there are no bellows connecting the turret with a second surface of the base opposite the first surface of the base.

Implementation 20: The apparatus of implementation 18, wherein: the bellows has a first average enclosed cross-sectional area when viewed along the first axis, the outermost surface or surfaces of the first portion of the turret define a second average cross-sectional area when viewed along the first axis, and the first average enclosed cross-sectional area is substantially equal to the second average cross-sectional area.

Implementation 21: The apparatus of implementation 18, wherein: the first portion of the turret is nominally circular and has a first nominal diameter, the bellows has a plurality of pleats, each pleat has an inner diameter and an outer diameter, and the average of the inner diameters and outer diameters of the pleats is substantially equal to the first nominal diameter.

Implementation 22: The apparatus of implementation 18, wherein the base has one or more vents in the surface of the base and within a region encircled by the bellows when viewed along the first axis.

Implementation 23: The apparatus of implementation 18, wherein: the aperture has one or more radial gas passages extending around substantially all of the aperture, the one or more radial gas passages are fixed in size, a first gap exists between an interior edge of the aperture and the first portion of the turret, and the first gap extends around the outer perimeter of the first portion of the turret.

Implementation 24: The apparatus of implementation 23, wherein the first gap between the first portion of the turret and the interior edge of the aperture is free of any intervening structure.

Implementation 25: The apparatus of implementation 23, wherein the one or more radial gas passages have a minimum width in a direction parallel to the first axis that is less than 1 mm.

Implementation 26: The apparatus of implementation 23, wherein the one or more radial gas passages have a minimum width in a direction parallel to the first axis that is less than 0.5 mm.

Implementation 27: The apparatus of implementation 23, wherein the one or more radial gas passages have a minimum width in a direction parallel to the first axis that is less than or equal to 0.25 mm.

Implementation 28: The apparatus of implementation 23, wherein: the one or more radial gas passages are at least partially defined by one or more first surfaces and one or more second surfaces, and the one or more first surfaces face towards the one or more second surfaces and are separated from the one or more second surfaces by a second gap.

Implementation 29: The apparatus of implementation 28, wherein the one or more first surfaces and the one or more second surfaces are perpendicular to the first axis.

Implementation 30: The apparatus of implementation 28, wherein: each of the one or more first surfaces defines a first cross-sectional radial profile with respect to a second axis that is parallel to the first axis and centered on the aperture, each of the one or more second surfaces defines a second cross-sectional radial profile with respect to the second axis, the cross-sectional radial profiles including the one or more first cross-sectional radial profiles and the one or more second cross-sectional radial profiles are each in a corresponding plane that is coincident with and parallel to the second axis, each first cross-sectional radial profile defines an average first linear radial profile that is within ±30° of perpendicular to the second axis, and each second cross-sectional radial profile defines an average second linear radial profile that is within ±30° of perpendicular to the second axis.

Implementation 31: The apparatus of implementation 23, further comprising: one or more plenum volumes; one or more gas inlets; and one or more flow control components configured to regulate flow of gas to the one or more gas inlets, wherein: each gas inlet is fluidically connected with one of the one or more plenum volumes, each of the one or more plenum volumes is fluidically connected with at least one of the one or more gas inlets, each of the one or more gas inlets is fluidically interposed between one of the one or more plenum volumes and one of the one or more flow control components, and each of the one or more plenum volumes is fluidically interposed between one of the one or more gas inlets and the one or more radial gas passages.

Implementation 32: The apparatus of implementation 31, further comprising one or more gas sources, wherein: the one or more flow control components are fluidically connected with the one or more gas sources and are configured to cause gas from the one or more gas sources to be provided to the one or more plenum volumes at a rate of between 25 and 150 standard liters per minute and the one or more radial gas passages are sized such that the gas from the one or more plenum volumes flows from the one or more radial gas passages with a velocity of at least 5 m/s.

Implementation 33: The apparatus of implementation 23, wherein the first portion of the turret has a first nominally circular cross-section and the aperture has a corresponding second nominally circular cross-section with a diameter larger than the diameter of the first nominally circular cross-section.

Implementation 34: The apparatus of implementation 23, wherein the one or more radial gas passages includes only a single gas passage that is in the form of a radial slit that extends around the entire aperture without any disruptions in continuity.

Implementation 35: The apparatus of implementation 23, wherein the first gap is between 0.5 mm and 5 mm around the turret.

What is claimed is:
1. An apparatus comprising:
one or more robot arms;
a turret supporting the one or more robot arms;
a linear translation mechanism supporting the turret; and a base supporting the linear translation mechanism, wherein:
the linear translation mechanism is configured to translate the turret, as well as the one or more robot arms, along a first axis relative to the base,
the base includes an aperture sized to allow at least a first portion of the turret to pass therethrough when the turret is translated along the first axis,
the aperture has one or more radial gas passages extending around substantially all of the aperture and configured to direct gas inwards towards the turret,
the one or more radial gas passages are fixed in size,
a first gap exists between an interior edge of the aperture and the first portion of the turret, and
the first gap extends around the outer perimeter of the first portion of the turret.

2. The apparatus of claim 1, wherein the first gap between the first portion of the turret and the interior edge of the aperture is free of any intervening structure around substantially all of the turret.

3. The apparatus of claim 1, wherein the one or more radial gas passages have a minimum width in a direction parallel to the first axis that is less than 1 mm.

4. The apparatus of claim 1, wherein the one or more radial gas passages have a minimum width in a direction parallel to the first axis that is less than 0.5 mm.

5. The apparatus of claim 1, wherein the one or more radial gas passages have a minimum width in a direction parallel to the first axis that is less than or equal to 0.25 mm.

6. The apparatus of claim 1, wherein:
the one or more radial gas passages are at least partially defined by one or more first surfaces and one or more second surfaces, and
the one or more first surfaces face towards the one or more second surfaces and are separated from the one or more second surfaces by a second gap.

7. The apparatus of claim 6, wherein the one or more first surfaces and the one or more second surfaces are perpendicular to the first axis.

8. The apparatus of claim 6, wherein:
each of the one or more first surfaces defines a first cross-sectional radial profile with respect to a second axis that is parallel to the first axis and centered on the aperture,
each of the one or more second surfaces defines a second cross-sectional radial profile with respect to the second axis,
the cross-sectional radial profiles including the one or more first cross-sectional radial profiles and the one or more second cross-sectional radial profiles are each in a corresponding plane that is coincident with and parallel to the second axis,
each first cross-sectional radial profile defines an average first linear radial profile that is within ±30° of perpendicular to the second axis, and
each second cross-sectional radial profile defines an average second linear radial profile that is within ±30° of perpendicular to the second axis.

9. The apparatus of claim 1, further comprising:
one or more plenum volumes;
one or more gas inlets; and
one or more flow control components configured to regulate flow of gas to the one or more gas inlets, wherein:
each gas inlet is fluidically connected with one of the one or more plenum volumes,
each of the one or more plenum volumes is fluidically connected with at least one of the one or more gas inlets,
each of the one or more gas inlets is fluidically interposed between one of the one or more plenum volumes and one of the one or more flow control components, and
each of the one or more plenum volumes is fluidically interposed between one of the one or more gas inlets and the one or more radial gas passages.

10. The apparatus of claim 9, further comprising one or more gas sources, wherein:
the one or more flow control components are fluidically connected with the one or more gas sources and are configured to cause gas from the one or more gas sources to be provided to the one or more plenum volumes at a rate of between 25 and 150 standard liters per minute and the one or more radial gas passages are sized such that the gas from the one or more plenum volumes flows from the one or more radial gas passages with a velocity of at least 5 m/s.

11. The apparatus of claim 1, wherein the first portion of the turret has a first nominally circular cross-section and the aperture has a corresponding second nominally circular cross-section with a diameter larger than the diameter of the first nominally circular cross-section.

12. The apparatus of claim 1, wherein the one or more radial gas passages includes only a single gas passage that is in the form of a radial slit that extends around the entire aperture without any disruptions in continuity.

13. The apparatus of claim 1, wherein the first gap is between 0.5 mm and 5 mm around the turret.

14. The apparatus of claim 1, further comprising a bellows, wherein:
a first end of the bellows is fixed relative to an end of the turret located within the base,
a second end of the bellows opposite the first end is fixed relative to a surface of the base on an opposite side of the base from the aperture,
the bellows expands responsive to translation of the turret away from the surface of the base, and
the bellows contracts responsive to translation of the turret towards the surface of the base.

15. The apparatus of claim 14, wherein:
the bellows has a first average enclosed cross-sectional area when viewed along the first axis,
the outermost surface or surfaces of the first portion of the turret define a second average cross-sectional area when viewed along the first axis, and
the first average enclosed cross-sectional area is substantially equal to the second average cross-sectional area.

16. The apparatus of claim 14, wherein:
the first portion of the turret is nominally circular and has a first nominal diameter,
the bellows has a plurality of pleats,
each pleat has an inner diameter and an outer diameter, and
the average of the inner diameters and outer diameters of the pleats is substantially equal to the first nominal diameter.

17. The apparatus of claim 14, wherein the base has one or more vents in the surface of the base and within a region encircled by the bellows when viewed along the first axis.

* * * * *